US008684709B2

(12) United States Patent
Huang et al.

(10) Patent No.: US 8,684,709 B2
(45) Date of Patent: Apr. 1, 2014

(54) MICRO COOLING FAN

(75) Inventors: Chung-Chun Huang, Taichung (TW); Chien-Chang Wang, Hsinchu County (TW); Kun-Yi Liang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 7 days.

(21) Appl. No.: 12/853,012

(22) Filed: Aug. 9, 2010

(65) Prior Publication Data
US 2011/0290456 A1 Dec. 1, 2011

(30) Foreign Application Priority Data
May 28, 2010 (TW) ................. 99117314 A

(51) Int. Cl.
*F28F 13/00* (2006.01)
(52) U.S. Cl.
USPC ............... 417/423.7; 417/44.1; 417/423.1; 310/68 R
(58) Field of Classification Search
USPC .............. 417/44.1, 353, 354, 423.1, 423.7; 310/68 B, 71, 156.06, 67 R
See application file for complete search history.

(56) References Cited

U.S. PATENT DOCUMENTS

| 6,525,938 | B1   | 2/2003  | Chen     |         |
|-----------|------|---------|----------|---------|
| 6,713,907 | B2 * | 3/2004  | Matsumoto| 310/67 R|
| 8,419,385 | B2 * | 4/2013  | Horng    | 417/353 |
| 2003/0117029 | A1 * | 6/2003 | Horng et al. | 310/89 |
| 2003/0122443 | A1 | 7/2003 | Chen | |
| 2005/0106046 | A1 * | 5/2005 | Winkler | 417/423.3 |
| 2007/0114869 | A1 * | 5/2007 | Horng et al. | 310/156.32 |
| 2008/0279694 | A1 | 11/2008 | Chou et al. | |
| 2009/0155097 | A1 * | 6/2009 | Winkler | 417/354 |
| 2009/0175744 | A1 * | 7/2009 | Alex et al. | 417/423.7 |

FOREIGN PATENT DOCUMENTS

| CN | 1301078 A | 6/2001 |
| CN | 2517166 Y | 10/2002 |
| CN | 101307769 A | 11/2008 |

(Continued)

OTHER PUBLICATIONS

State Intellectual Property Office of the People's Republic of China, "Office Action", Oct. 15, 2012, China.

(Continued)

*Primary Examiner* — Peter J Bertheaud
*Assistant Examiner* — Dominick L Plakkoottam
(74) *Attorney, Agent, or Firm* — Morris Manning & Martin LLP; Tim Tingkang Xia, Esq.

(57) ABSTRACT

A micro cooling fan includes a housing, a fan wheel, and a main circuit board. The main circuit board has a stator and a driving circuit. The stator is electrically connected to the driving circuit. The stator is disposed on a first inner surface, and the driving circuit is disposed on a first outer surface, so that the housing and the driving circuit of the micro fan motor form an integral structure. The first outer surface is opposite to the first inner surface, or the first outer surface is located on a side surface of the housing. Therefore, by disposing the driving circuit on the first outer surface, the wind resistance of the fan blades is reduced, and the air volume of the micro cooling fan is increased accordingly, so that the cooling effect of the micro cooling fan is improved.

8 Claims, 10 Drawing Sheets

(56) References Cited

FOREIGN PATENT DOCUMENTS

| | | | |
|---|---|---|---|
| CN | 101309029 | A | 11/2008 |
| CN | 101451536 | A | 6/2009 |
| EP | 1820971 | A1 | 8/2007 |
| TW | 247005 | | 5/1995 |
| TW | 438150 | | 5/2001 |
| TW | 560770 | U | 11/2003 |
| TW | M337965 | | 2/2008 |

OTHER PUBLICATIONS

Intellectual Property Office, Ministry of Economic Affairs, R.O.C., "Office Action", Aug. 20, 2012, Taiwan.

State Intellectual Property Office of the People's Republic of China, "Office Action", Jun. 26, 2013, China.

State Intellectual Property Office of the People's Republic of China, "Office Action", Mar. 15, 2013, China.

\* cited by examiner

MICRO COOLING FAN

CROSS-REFERENCE TO RELATED APPLICATIONS

This non-provisional application claims priority under 35 U.S.C. §119(a) on Patent Application No(s). 099117314 filed in Taiwan, R.O.C. on May 28, 2010, the entire contents of which are hereby incorporated by reference.

BACKGROUND OF THE INVENTION

1. Field of the Invention

The present invention relates to a micro cooling fan, and more particularly to a micro cooling fan in which a driving circuit is disposed on an outer surface of a housing to achieve an integral structure of the housing and the driving circuit of a micro fan motor.

2. Related Art

In recent years, an electronic device is disposed with a variety of electronic elements, such as a central processing unit and a power supply. Since the electronic elements will generate a lot of heat when the electronic device is running, a cooling fan needs to be mounted to remove heat, so as to prevent the life of the electronic elements from being shortened due to an excessively high temperature of the electronic elements.

A direct current fan motor structure which is disclosed uses a control circuit device to control the electromagnetic effect of a stator device such that a rotor device is rotated by an electromagnetic repulsive force of the stator device. In the stator device, a hollow coil set is sleeved on a ring magnet of a magnetically conductive sleeve, and an upper silicon-steel sheet and a lower silicon-steel sheet of a silicon-steel sheet set are disposed on a top edge and a bottom edge of the magnetically conductive sleeve and the ring magnet respectively. The main characteristic lies in that a periphery of each silicon-steel sheet is provided with four symmetric protruding portions. Wherein, the four protruding portions of the upper silicon-steel sheet and the four protruding portions of the lower silicon-steel sheet are alternately arranged, and one side edge of each protruding portion is slightly larger than the other side edge, thereby forming an asymmetric design. Since the control circuit device is located below the stator and in an axial direction of the fan, poor heat dissipation is caused, resulting in that the life of electronic elements on the control circuit device is reduced. Moreover, since the area of the electronic elements disposed on the control circuit device is limited by a maximum outer diameter of the motor, it is difficult to arrange and dispose the electronic elements.

A cooling fan which is disclosed includes a frame and a fan wheel. The frame has an air-intake surface, an air-outlet surface, an inner annular wall, an axial air channel, and a bearing portion. The bearing portion is formed on at least a portion of a frame edge, and includes a first side wall, a second side wall, and a loading space. The first side wall is formed by at least a portion of the inner annular wall, and the second side wall is spaced apart from the first side wall. The loading space is formed between the first side wall and the second side wall, and is used to bear a driving circuit board. Since the driving circuit is placed in the loading space of the inner annular wall, the air volume of the cooling fan is increased, and the cooling problem of the driving circuit is solved. However, in the manufacturing process of the above cooling fan, the loading space needs to be disposed in the inner annular wall of the frame to place the driving circuit. The manufacturing process of the frame is complex, and a consideration has to be given to the cooling of the driving circuit.

In addition, when the cooling fan is used in an Internet terminal, the cooling fan needs to be miniaturized. However, in the miniaturization process of the cooling fan, a three-phase motor structure needs to be used so as to lower the power consumption of the cooling fan, and since the three-phase motor requires a larger disposition space than a single-phase motor, a problem regarding whether a micro cooling fan has an extra space for disposing the driving circuit is imposed.

SUMMARY OF THE INVENTION

Accordingly, the present invention is a micro cooling fan, in which a driving circuit and a housing of the micro cooling fan are integrated to form an integral structure, such that the wind resistance of the micro cooling fan is reduced, thereby improving the cooling effect of the micro cooling fan; no consideration needs to be given to the cooling of the driving circuit; and the problem that the micro cooling fan has no extra space for disposing the driving circuit is solved.

In an embodiment, the micro cooling fan comprises a housing, a fan wheel, and a main circuit board. The housing has an accommodation space, a first inner surface, and a first outer surface. The fan wheel has a plurality of fan blades and is disposed in the accommodation space. The main circuit board comprises a first circuit board and a second circuit board. A stator is disposed on the first circuit board, a driving circuit is disposed on the second circuit board, and the stator is electrically connected to the driving circuit. The first circuit board is disposed on the first inner surface, and the second circuit board is disposed on the first outer surface.

In another embodiment, the micro cooling fan comprises a housing and a main circuit board. The housing has an accommodation space, a first inner surface, and a gap. The gap is in communication with the accommodation space, and two opposite side edges of the gap have a groove respectively. The main circuit board comprises a first circuit board and a second circuit board. The first circuit board has a stator, the second circuit board has a driving circuit, and the stator is electrically connected to the driving circuit. The first circuit board is disposed on the first inner surface, and the second circuit board is embedded into the grooves and blocks the gap.

The micro cooling fan according to the above embodiments can be applied to an electronic device. The second circuit board on which the driving circuit is disposed may be directly disposed on the first outer surface of the housing, or be embedded into the housing and thus become a part of the housing. Owing to the above micro cooling fan, the driving circuit and the housing of the micro cooling fan are integrated to form an integral structure that makes no consideration of the cooling of the driving circuit, reduces the wind resistance of the micro cooling fan, and thereby improves the cooling effect of the micro cooling fan. In addition, the micro cooling fan solves the problem that no extra space can be provided for disposing the driving circuit.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1A:
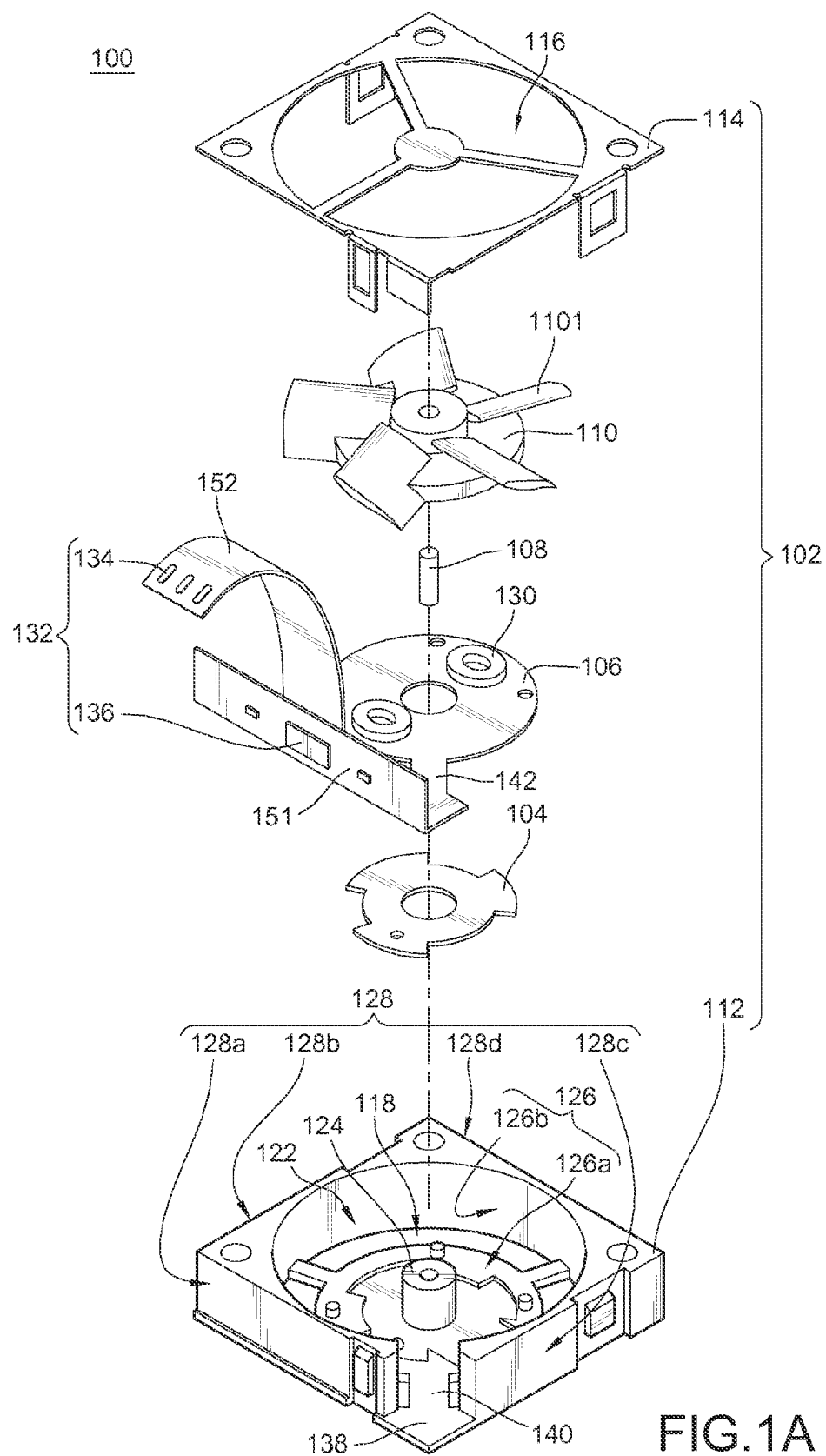
FIG. 1A is a three-dimensional exploded view according to a first embodiment of the present invention.
Figure 1B:
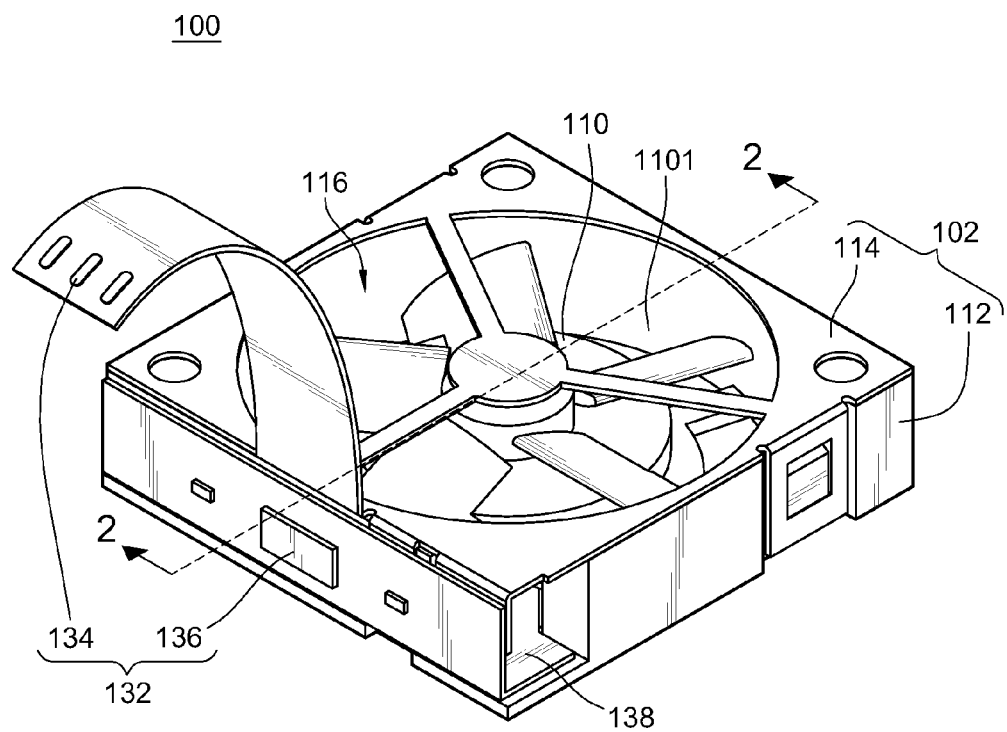
FIG. 1B is a three-dimensional assembled view according to the first embodiment of the present invention.

FIG. 1A and FIG. 1B are respectively a three-dimensional exploded view and a three-dimensional assembled view according to a first embodiment of the present invention. Referring to FIG. 1A and FIG. 1B, a micro cooling fan 100 comprises a housing 102, a magnetic block 104, a main circuit board 106, a bearing 108, and a fan wheel 110. The housing 102 in this embodiment may be formed by two sub-housings, but is not limited thereto. As can be seen from the figures, the housing 102 is formed by an outer frame 112 and a top cover 114. The housing 102 has an air-intake surface 116 and an air-outlet surface 118 opposite to each other, an air channel 120, an accommodation space 122, a bearing support 124, a first inner surface 126, and a first outer surface 128. The air-intake surface 116 may be disposed on a surface of the top cover 114, and the air-outlet surface 118 may be disposed on a surface of the outer frame 112; however, this embodiment is not intended to limit the present invention. For example, the air-intake surface 116 may be disposed on a surface of the outer frame 112, and the air-outlet surface 118 may be disposed on a surface of the top cover 114.

Figure 2:
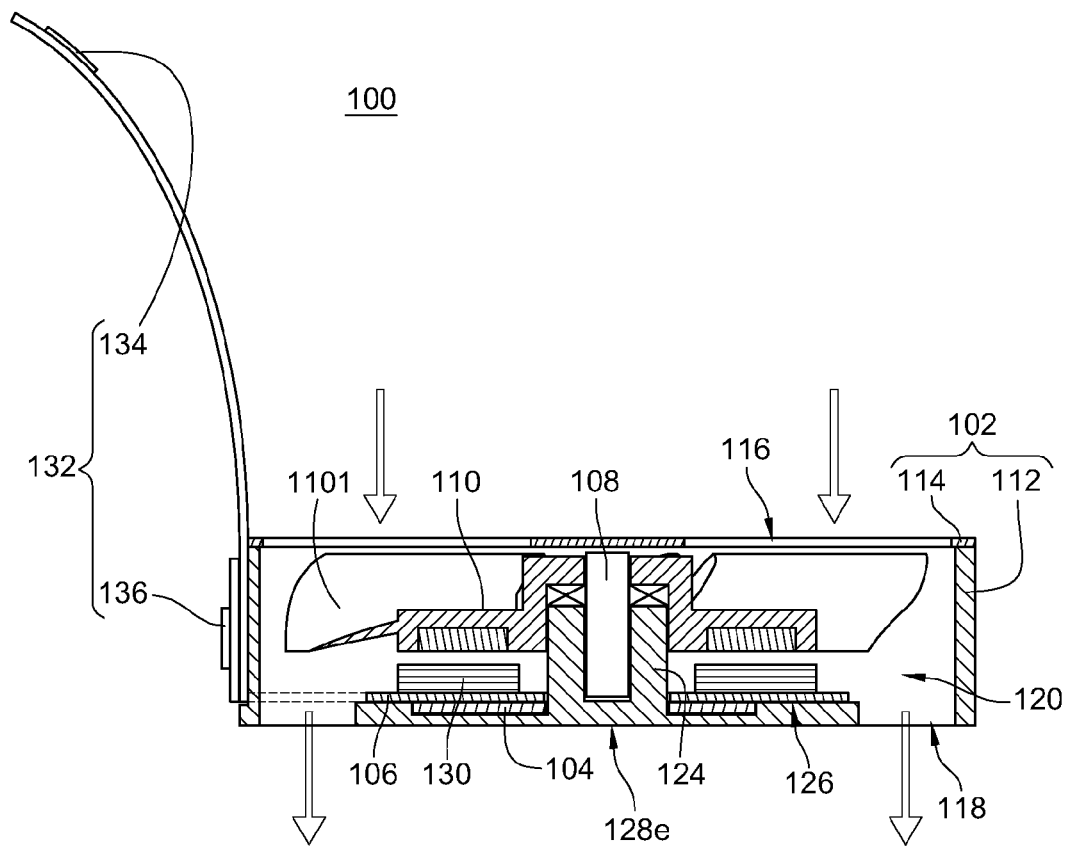
FIG. 2 is a schematic cross-sectional view along Line 2-2 in FIG. 1B.

FIG. 2 is a schematic cross-sectional view along Line 2-2 in FIG. 1B. Referring to FIG. 2, the air channel 120 is disposed between the air-intake surface 116 and the air-outlet surface 118, and runs through the housing 102. The micro cooling fan 100 achieves a cooling effect by guiding an air flow to flow through the air channel 120 (that is, in a direction pointed by arrows in FIG. 2). The accommodation space 122 is used to place the magnetic block 104, the main circuit board 106, and the fan wheel 110. The fan wheel 110 is pivoted to the bearing support 124 by the bearing 108, and can rotate relative to the air-outlet surface 118. The fan wheel has five fan blades 1101, but the number of the fan blades 1101 is not limited thereto. The bearing support 124 and the magnetic block 104 are disposed on the first inner surface 126. The magnetic block 104 is used to increase the magnetic flux density in the air gap.

The first inner surface 126 may be a surface surrounding the accommodation space 122, such as an inner bottom surface 126a and an inner annular wall 126b. The first outer surface 128 may be a surface of the housing 102 in contact with an external environment, such as four outer side surfaces 128a, 128b, 128c, and 128d, and an outer bottom surface 128e (see FIG. 1A and FIG. 2). In this embodiment, the first inner surface 126 is a surface surrounding the accommodation space 122 and opposite to the air-outlet surface 118 in the outer frame 122 (that is, the inner bottom surface 126a), the first outer surface 128 is an outer side surface in the housing 102 (that is, the outer side surface 128a), and the first outer surface 128 is perpendicular to the air-outlet surface 118 and the air-intake surface 116; however, this embodiment is not intended to limit the present invention.

Figure 3:
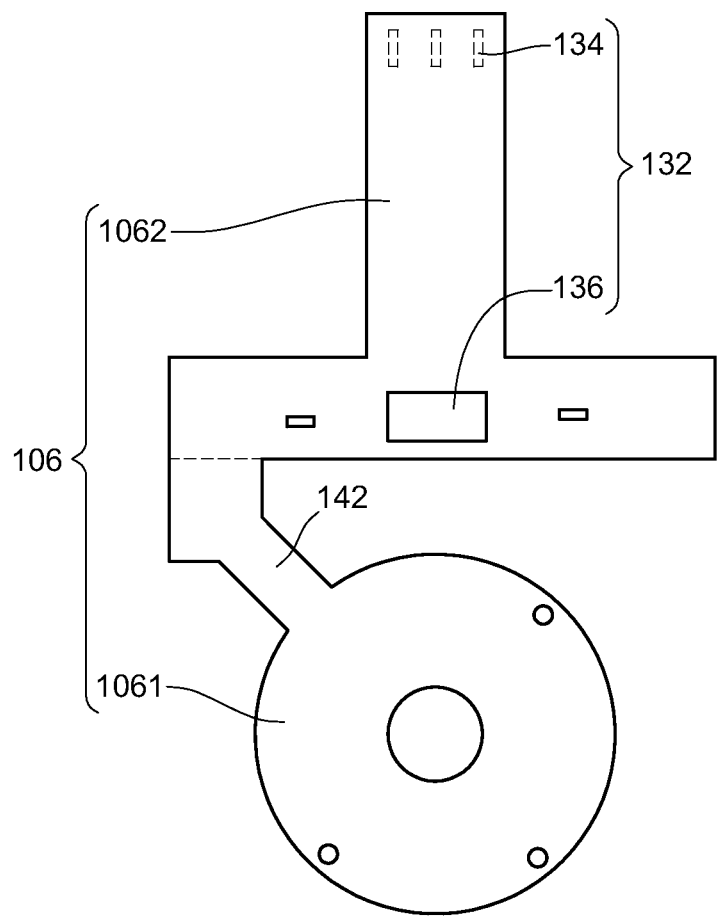
FIG. 3 is a schematic view of a main circuit board according to the first embodiment of the present invention.

FIG. 3 is a schematic view of a main circuit board according to the first embodiment of the present invention. Referring to FIG. 3, the main circuit board 106 comprises a first circuit board 1061 and a second circuit board 1062. The main circuit board 106 may be an integral circuit board (that is, the first circuit board 1061 and the second circuit board 1062 are the same circuit board), or a combined circuit board (that is, the first circuit board 1061 and the second circuit board 1062 are combined into the main circuit board 106). In this embodiment, the first circuit board 1061 and the second circuit board 1062 are the same circuit board, and an embodiment in which the first circuit board 1061 and the second circuit board 1062 are combined into the main circuit board 106 will be described in detail later.

The design of the first circuit board 1061 and the second circuit board 1062 are integrated, i.e. during the layout and production process, the first circuit board 1061 is connected to the second circuit board 1062. The first circuit board 1061 may use a flexible circuit board to be electrically connected to the second circuit board 1062. Therefore, during assembling process, it is easy to dispose the first circuit board 1061 in the accommodation space 122, and dispose the second circuit board 1062 on the first outer surface 128 of the housing 102.

Referring to FIG. 2, a stator 130 is disposed on the first circuit board 1061, and a driving circuit 132 is disposed on the second circuit board 1062. The stator 130 may be, but is not limited to, a set of stator coils. The driving circuit 132 comprises a connecting terminal 134 and a driving element 136. The stator 130 is electrically connected to the driving circuit 132, and the driving circuit 132 is connected to an external power by the connecting terminal 134, such that the driving element 136 generates a driving current to drive the stator 130 (that is, a set of stator coils). The driven stator 130 generates a magnetic field to drive the fan wheel 110 to rotate.

Furthermore, the second circuit board 132 comprises a first plate portion 151 and a second plate portion 152 perpendicular to the first plate portion, and the first plate portion 151 of the second circuit board 132 covers one side of the first outer surface 128.

In this embodiment, since the stator 130 and the fan wheel 110 are disposed on the first inner surface 126, the area of the stator 130 and the fan wheel 110 is smaller than or equal to the area of the first inner surface 126, so as to reduce the wind resistance when air flows into or out of the air channel 120. By disposing the driving circuit 132 on the first outer surface 128, the problem that the micro cooling fan has no extra space for disposing the driving circuit is solved, and the cooling effect can be achieved by thermal convection between the driving circuit 132 and the external environment.

Referring to FIG. 1A and FIG. 3, in this embodiment, the outer frame 112 further has an opening 138 and a rib 140, and the first circuit board 1061 has a connecting board 142. The opening 138 is a position for placing the connecting board 142 such that the connecting board 142 connects the first circuit board 1061 and the second circuit board 1062. The connecting board 142 is disposed on the rib 140, and the width of the connecting board 142 is smaller than or equal to the width of the rib 140, so as to reduce the wind resistance when air flows into or out of the air channel 120. The micro cooling fan 100 refers to a micro cooling fan having a length less than twenty centimeters, a width less than twenty centimeters, and a height less than ten centimeters.

Figure 4:
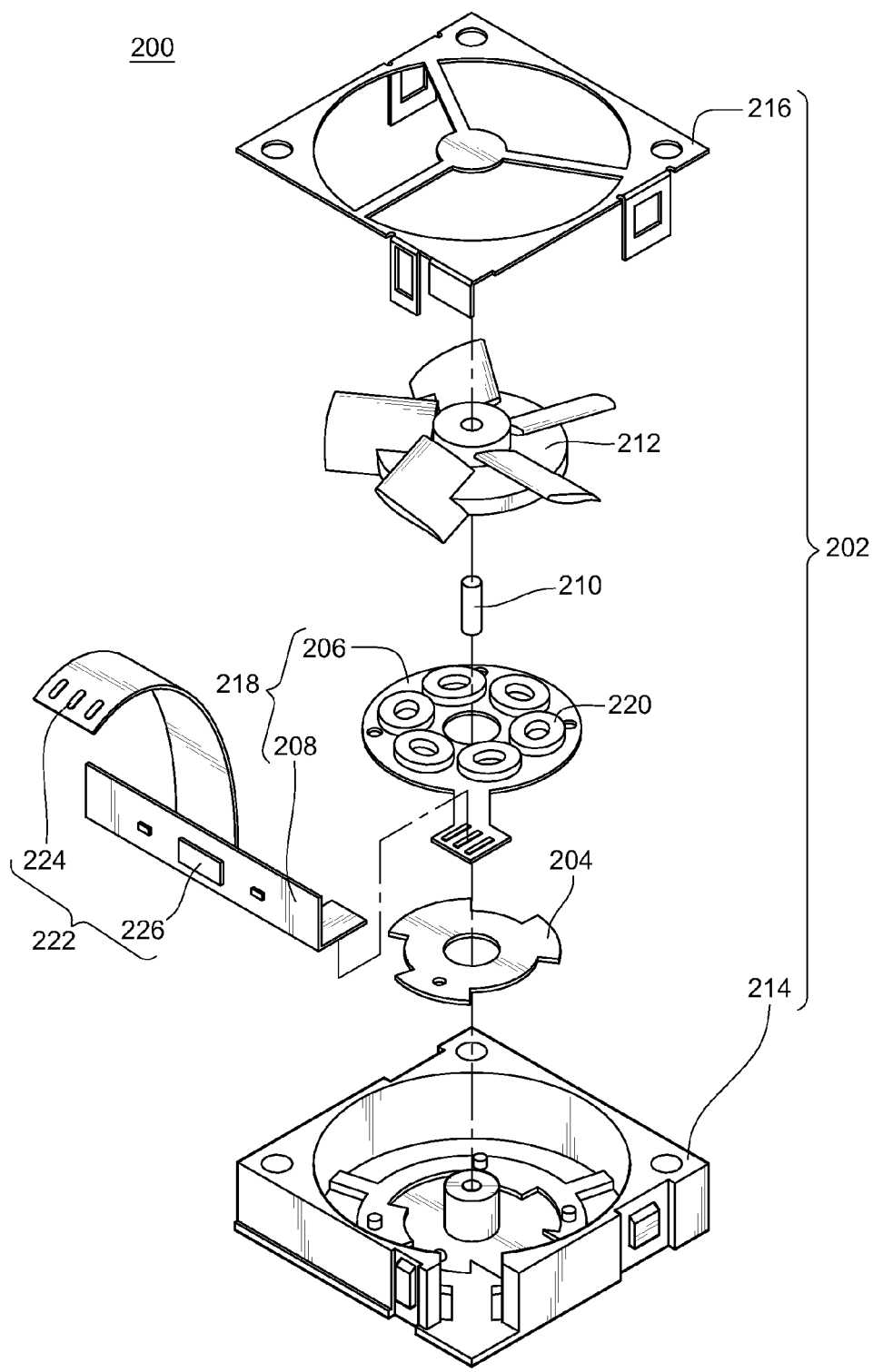
FIG. 4 is a three-dimensional exploded view according to a second embodiment of the present invention.

FIG. 4 is a three-dimensional exploded view according to a second embodiment of the present invention. Referring to FIG. 4, a micro cooling fan 200 comprises a housing 202, a magnetic block 204, a first circuit board 206, a second circuit board 208, a bearing 210, and a fan wheel 212. The housing 202 is formed by two sub-housings. In other words, the housing 202 is formed by an outer frame 214 and a top cover 216. The first circuit board 206 and the second circuit board 208 are combined into a main circuit board 218. A stator 220 is disposed on the first circuit board 206, a driving circuit 222 is disposed on the second circuit board 208, and the stator 220 is electrically connected to the driving circuit 222. The stator 220 may be, but is not limited to, three sets of stator coils. The driving circuit 222 comprises a connecting terminal 224 and a driving element 226. Both the first circuit board 206 and the second circuit board 208 may be flexible substrates, or the first circuit board 206 is a flexible substrate while the second circuit board 208 is a rigid substrate, which can be selected according to practical requirements.

Figure 5:
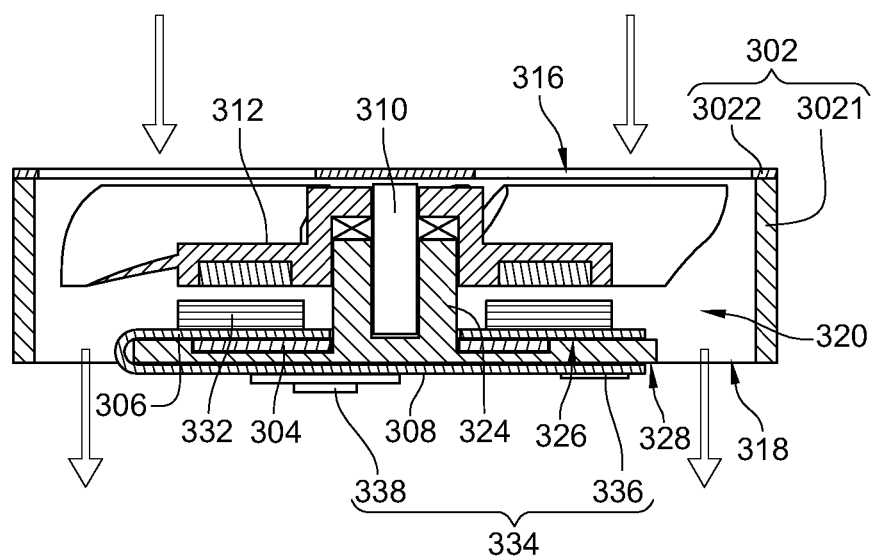
FIG. 5 is a schematic cross-sectional view according to a third embodiment of the present invention.

FIG. 5 is a schematic cross-sectional view according to a third embodiment of the present invention. Referring to FIG. 5, a micro cooling fan 300 comprises a housing 302, a magnetic block 304, a first circuit board 306, a second circuit board 308, a bearing 310, and a fan wheel 312. The housing 302 has an air-intake surface 316 and an air-outlet surface 318 opposite to each other, an air channel 320, a bearing support 324, a first inner surface 326, and a first outer surface 328. The housing 302 is formed by an outer frame 3021 and a top cover 3022. The air-intake surface 316 may be disposed on a surface of the top cover 3022, and the air-outlet surface 318 may be disposed on a surface of the outer frame 3021; however, this embodiment is not intended to limit the present invention.

A main circuit board 330 comprises a first circuit board 306 and a second circuit board 308, and the first circuit board 306 and the second circuit board 308 are the same circuit board. A stator 332 is disposed on the first circuit board 306, a driving circuit 334 is disposed on the second circuit board 308, and the stator 332 is electrically connected to the driving circuit 334. The driving circuit 334 comprises a connecting terminal 336 and a driving element 338. The first circuit board 306 is disposed on the first inner surface 326, and the second circuit board 308 is disposed on the first outer surface 328. In this embodiment, the first inner surface 326 and the first outer surface 328 may be two opposite side surfaces of the air-outlet surface 318, and the first inner surface 326 is a surface surrounding the air channel 320.

Figure 6A:
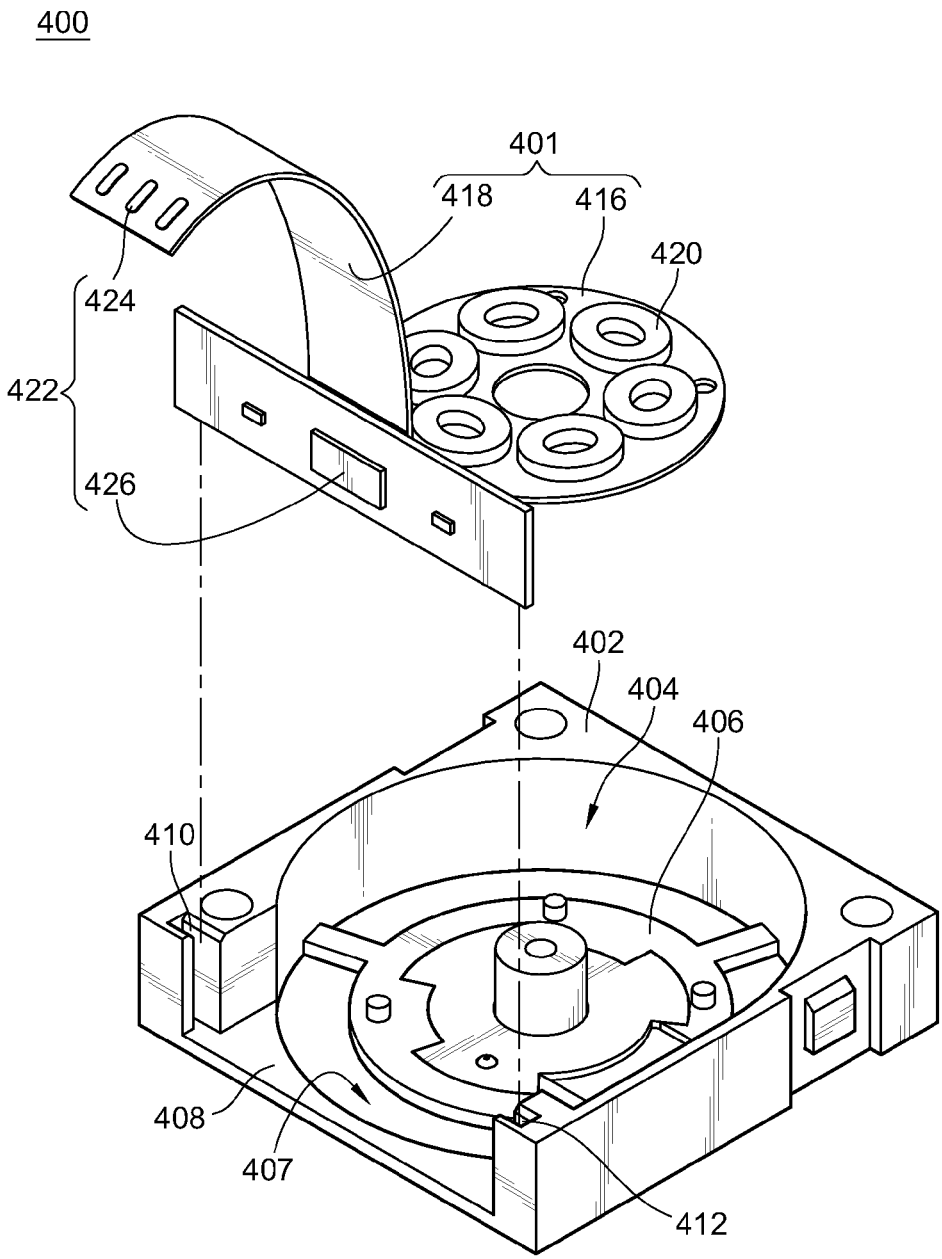
FIG. 6A is a three-dimensional exploded view of an outer frame and a main circuit board according to a fourth embodiment of the present invention.
Figure 6B:
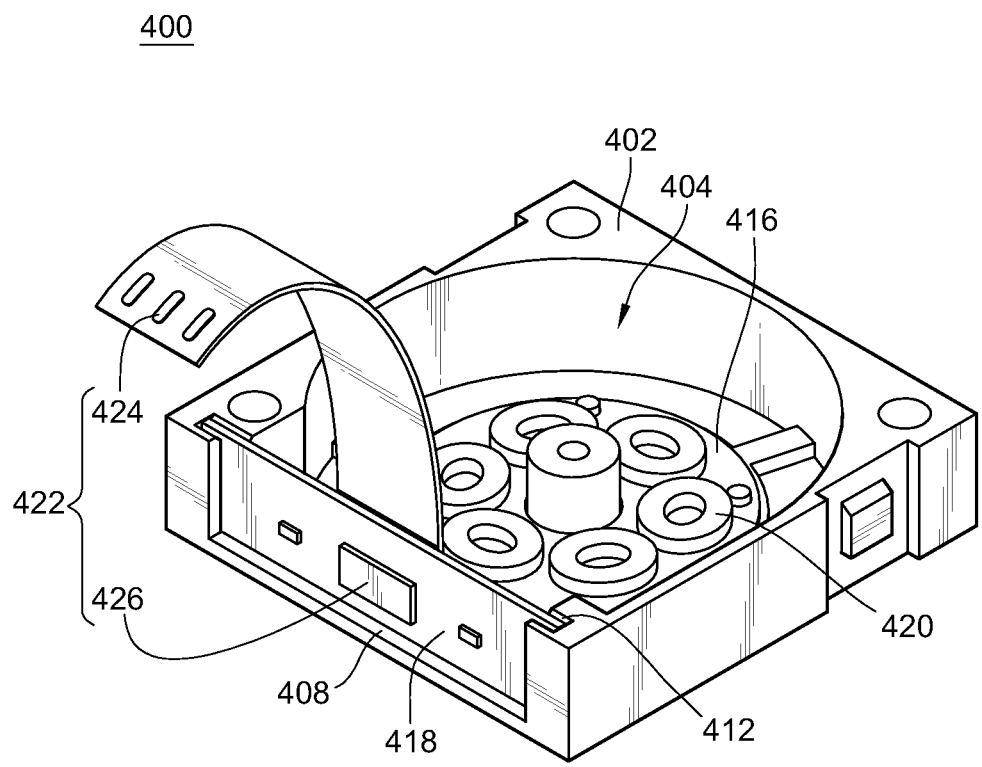
FIG. 6B is a three-dimensional assembled view of the outer frame and the main circuit board according to the fourth embodiment of the present invention.

FIG. 6A and FIG. 6B are respectively a three-dimensional exploded view and a three-dimensional assembled view of an outer frame and a main circuit board according to a fourth embodiment of the present invention. Referring to FIG. 6A and FIG. 6B, a micro cooling fan 400 comprises a housing and a main circuit board 401, and the housing is an outer frame 402. The outer frame 402 has an accommodation space 404, a first inner surface 406, an air-outlet surface 407, and a gap 408. The gap 408 is in communication with the accommodation space 404, and two opposite side edges of the gap 408 have grooves 410 and 412 respectively. In this embodiment, the first inner surface 406 is a surface surrounding the accommodation space 404 in the outer frame 402 and opposite to the air-outlet surface 407.

A main circuit board 401 comprises a first circuit board 416 and a second circuit board 418. The first circuit board 416 has a stator 420, and the second circuit board 418 has a driving circuit 422, and the stator 420 is electrically connected to the driving circuit 422. The first circuit board 416 is disposed on the first inner surface 406, and the second circuit board 418 is embedded into the grooves 410 and 412 and blocks the gap 408. In other words, the second circuit board 418 becomes a part of the outer frame 402. The stator 420 may be, but is not limited to, three sets of stator coils. The driving circuit 422 comprises a connecting terminal 424 and a driving element 426.

Figure 7A:
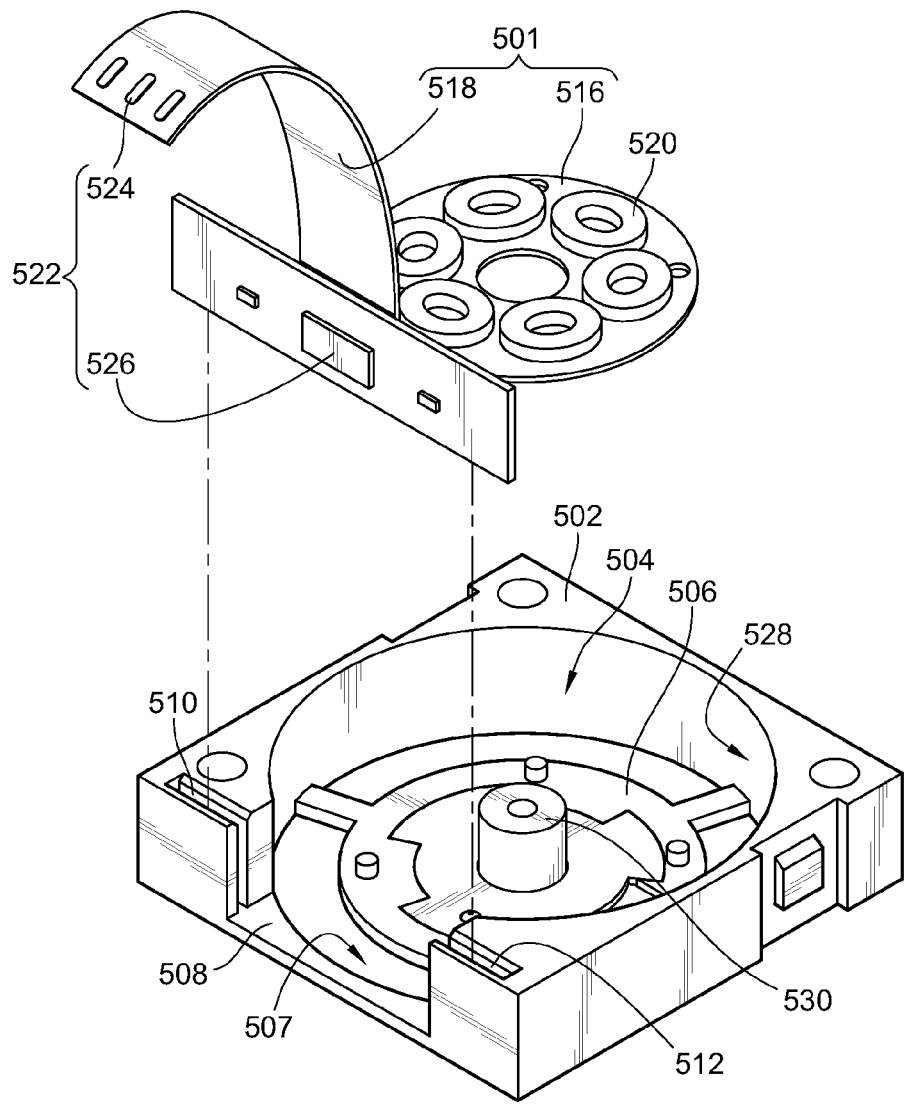
FIG. 7A is a three-dimensional exploded view of an outer frame and a main circuit board according to a fifth embodiment of the present invention.
Figure 7B:
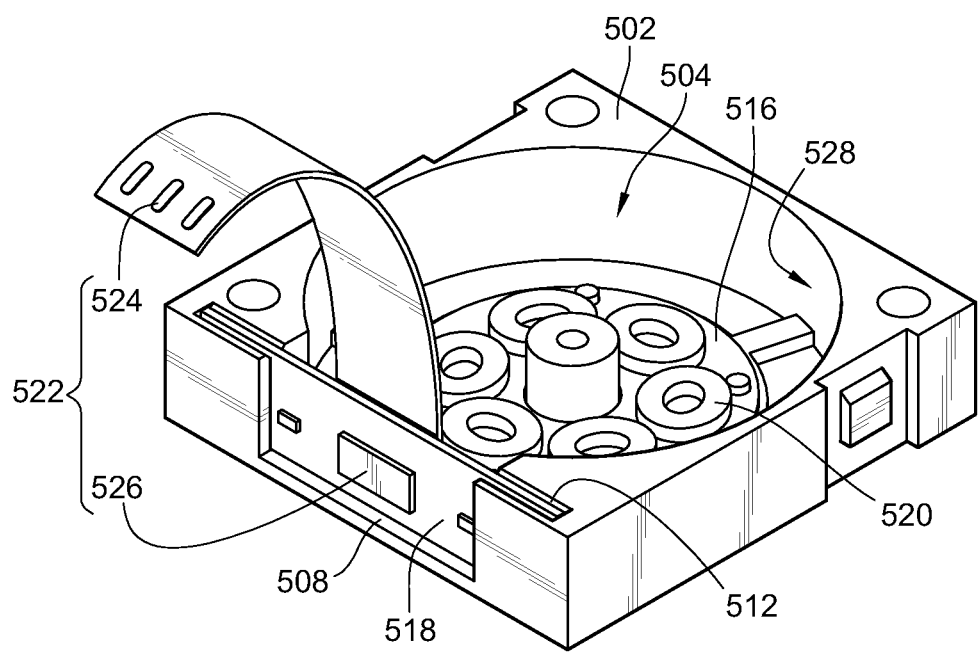
FIG. 7B is a three-dimensional assembled view of the outer frame and the main circuit board according to the fifth embodiment of the present invention.

FIG. 7A and FIG. 7B are respectively a three-dimensional exploded view and a three-dimensional assembled view of an outer frame and a main circuit board according to a fifth embodiment of the present invention. Referring to FIG. 7A and FIG. 7B, a micro cooling fan 500 comprises a housing and a main circuit board 501, and the housing is an outer frame 502. The outer frame 502 has an accommodation space 504, a first inner surface 506, an air-outlet surface 507, and a gap 508. The gap 508 is in communication with the accommodation space 504, and two opposite side edges of the gap 508 have grooves 510 and 512 respectively.

A main circuit board 501 comprises a first circuit board 516 and a second circuit board 518. The first circuit board 516 has a stator 520, the second circuit board 518 has a driving circuit 522, and the stator 520 is electrically connected to the driving circuit 522. The first circuit board 516 is disposed on the first inner surface 506, and the second circuit board 518 is embedded into the grooves 510 and 512 and blocks the gap 508. The stator 520 may be, but is not limited to, three sets of stator coils. The driving circuit 522 comprises a connecting terminal 524 and a driving element 526.

In this embodiment, the outer frame 502 has an inner annular wall 528 and a bearing support 530, and the inner annular wall 528 is in a form of an arc-shaped surface. The arc-shaped surface has an arc angle of 270 degrees to 330 degrees, and an axle center of the arc is parallel to the bearing support 530 of the micro cooling fan 500. The arc angle of the arc-shaped surface affects the wind resistance when air flows into or out of the outer frame 502, and the larger the arc angle of the arc-shaped surface is, the smaller the wind resistance will be. The second circuit board 518 that is embedded into the grooves 510 and 512 and blocks the gap 508 may be, but is not limited to, a rigid circuit board.

Based on the above, the micro cooling fan according to the above embodiments can be applied to an electronic device. The second circuit board on which the driving circuit is disposed may be directly disposed on the first outer surface of the housing, or be embedded into the housing and thus become a part of the housing. Owing to the above micro cooling fan, the driving circuit and the housing of the micro cooling fan are integrated to form an integral structure that makes no consideration for the cooling of the driving circuit, reduces the wind resistance of the micro cooling fan, thereby improves the cooling effect of the micro cooling fan, and solves the problem that the next-generation micro cooling fan has no extra space for disposing the driving circuit.

What is claimed is:

1. A micro cooling fan, comprising:
   a housing, having a wall body defining an accommodation space, a first inner surface at a first side of the wall body, a first outer surface which is physically a part of a second side of the wall body, with the second side opposite to the first side with respect to the wall body, the first outer surface comprises four sides, and the first inner surface comprises an inner bottom surface and an inner annular wall surface surrounding the inner bottom surface;
   a fan wheel, having a plurality of fan blades and disposed in the accommodation space to which the first inner surface faces; and a main circuit board, comprising a first circuit board and a second circuit board, wherein a stator is disposed on the first circuit board, a driving circuit is disposed on the second circuit board, the stator is electrically connected to the driving circuit, the first circuit board is disposed on the inner bottom surface, the second circuit board comprises a first plate portion and a second plate portion perpendicular to the first plate portion, and the first plate portion of the second circuit board covers the entire width of one side of the first outer surface;

wherein the housing further has an opening and a rib extending along the radial direction of the fan wheel, the first circuit board has a connecting board, the opening is a position for placing the connecting board such that the connecting board connects the first circuit board and the second circuit board, the connecting board is disposed on the rib, and the width of the connecting board is smaller than or equal to the width of the rib.

2. The micro cooling fan according to claim 1, wherein the stator is a set of stator coils.

3. The micro cooling fan according to claim 1, wherein the stator is three sets of stator coils.

4. The micro cooling fan according to claim 1, wherein the main circuit board is a combined circuit board.

5. The micro cooling fan according to claim 1, wherein the driving circuit comprises a connecting terminal and a driving element.

6. The micro cooling fan according to claim 1, wherein a magnetic block is disposed between the first inner bottom surface and the first circuit board, the stator and the magnetic block are disposed on the opposite sides of the first circuit board respectively and two opposite surfaces of the magnetic block are directly contacted with the first inner bottom surface and the first circuit board respectively.

7. The micro cooling fan according to claim 1, wherein the area of the stator and the fan wheel is smaller than or equal to the area of the first inner surface.

8. The micro cooling fan according to claim 1, wherein the driving circuit has only one driving element disposed thereon.

* * * * *